(12) United States Patent
Hu et al.

(10) Patent No.: US 9,450,612 B2
(45) Date of Patent: Sep. 20, 2016

(54) ENCODING METHOD AND SYSTEM FOR QUASI-CYCLIC LOW-DENSITY PARITY-CHECK CODE

(71) Applicant: NEC Laboratories America, Inc., Princeton, NJ (US)

(72) Inventors: Junqiang Hu, Princeton, NJ (US); Ting Wang, West Windsor, NJ (US)

(73) Assignee: NEC Corporation (JP)

( * ) Notice: Subject to any disclaimer, the term of this patent is extended or adjusted under 35 U.S.C. 154(b) by 141 days.

(21) Appl. No.: 14/454,996

(22) Filed: Aug. 8, 2014

(65) Prior Publication Data

US 2015/0046768 A1    Feb. 12, 2015

Related U.S. Application Data

(60) Provisional application No. 61/864,743, filed on Aug. 12, 2013.

(51) Int. Cl.
*H03M 13/11* (2006.01)
*H03M 13/00* (2006.01)
*H04L 1/00* (2006.01)
*H03M 13/25* (2006.01)

(52) U.S. Cl.
CPC ......... *H03M 13/116* (2013.01); *H03M 13/611* (2013.01); *H03M 13/1177* (2013.01); *H03M 13/255* (2013.01); *H03M 13/616* (2013.01); *H04L 1/0057* (2013.01)

(58) Field of Classification Search
CPC ........... H03M 13/116; H03M 13/616; H03M 13/255; H03M 13/1177; H03M 13/611; H04L 1/0057
USPC ....................... 714/752, 758, 781
See application file for complete search history.

(56) References Cited

U.S. PATENT DOCUMENTS

| | | | |
|---|---|---|---|
| 8,219,868 B1* | 7/2012 | Chaichanavong ... | H03M 13/116 714/748 |
| 8,473,824 B1* | 6/2013 | Chaichanavong .. | H03M 13/033 714/758 |
| 9,037,945 B2* | 5/2015 | Wu ..................... | H03M 13/116 714/756 |
| 9,122,625 B1* | 9/2015 | Lu ....................... | G06F 11/1048 |
| 2008/0028274 A1* | 1/2008 | Lin ..................... | H03M 13/1108 714/752 |
| 2010/0257425 A1* | 10/2010 | Yue .................... | H03M 13/116 714/752 |
| 2011/0264987 A1* | 10/2011 | Li ........................ | H03M 13/116 714/785 |
| 2014/0281790 A1* | 9/2014 | Li ....................... | H03M 13/1171 714/755 |

OTHER PUBLICATIONS

Li, Z. et al. "Efficient Encoding of Quasi-Cyclic Low-Density Parity-Check Codes" IEEE Transactions on Communications, vol. 54, No. 1. Jan. 2006. pp. 71-81.

* cited by examiner

*Primary Examiner* — Guerrier Merant
*Assistant Examiner* — Sazzad Hossain
(74) *Attorney, Agent, or Firm* — Joseph Kolodka

(57) ABSTRACT

A method and system are provided. The method includes applying a quasi-cyclic matrix M to an input vector $X^-$ of encoded data to generate a vector Y. The method further includes applying a matrix Q to the vector Y to generate a vector Z. The method also includes recursively generating, using a processor, parity check bits P for the encoded data from the vector Z and an identity matrix variant $I^*$. The encoded data includes quasi-cyclic low-density parity-check code. The identity matrix variant $I^*$ is composed of Toeplitz sub-matrices.

14 Claims, 4 Drawing Sheets

ENCODING METHOD AND SYSTEM FOR QUASI-CYCLIC LOW-DENSITY PARITY-CHECK CODE

RELATED APPLICATION INFORMATION

This application claims priority to provisional application Ser. No. 61/864,743 filed on Aug. 12, 2013, incorporated herein by reference.

BACKGROUND

1. Technical Field

The present invention relates to signal processing, and more particularly to an encoding method and system for quasi low-density parity-check (LDPC) code.

2. Description of the Related Art

Low-Density-Parity-Check (LDPC) codes are commonly given in the form of a parity check matrix H. The generator matrix G is required to be orthogonal with parity the check matrix H, such that $H \cdot G^T = [O]$, where [O] is zero matrix. Generator matrix G is preferred to be in (or close to) systematic form, i.e., the form of [I|G'] where I is an identity matrix, so that the encoded data will be composed of direct information bits and parity check bits. Most of the existing encoding methods do not provide systematic form. Such methods increase encoding complexity, and also lead to the difficulty in direct extraction of information bits without decoding.

SUMMARY

These and other drawbacks and disadvantages of the prior art are addressed by the present principles, which are directed to an encoding method and system for quasi low-density parity-check (LDPC) code.

According to an aspect of the present principles, a method is provided. The method includes applying a quasi-cyclic matrix M to an input vector $X^-$ of encoded data to generate a vector Y. The method further includes applying a matrix Q to the vector Y to generate a vector Z. The method also includes recursively generating, using a processor, parity check bits P for the encoded data from the vector Z and an identity matrix variant I*. The encoded data includes quasi-cyclic low-density parity-check code. The identity matrix variant I* is composed of Toeplitz sub-matrices.

According to another aspect of the present principles, a computer program product is provided that includes a computer readable storage medium having computer readable program code embodied therein for performing a method. The method includes applying a quasi-cyclic matrix M to an input vector $X^-$ of encoded data to generate a vector Y. The method further includes applying a matrix Q to the vector Y to generate a vector Z. The method also includes recursively generating parity check bits P for the encoded data from the vector Z and an identity matrix variant I*. The encoded data includes quasi-cyclic low-density parity-check code. The identity matrix variant I* is composed of Toeplitz sub-matrices.

According to yet another aspect of the present principles, a system is provided. The system includes an encoder, having a processor, for applying a quasi-cyclic matrix M to an input vector $X^-$ of encoded data to generate a vector Y, applying a matrix Q to the vector Y to generate a vector Z, and recursively generating, using a processor, parity check bits P for the encoded data from the vector Z and an identity matrix variant I*. The encoded data includes quasi-cyclic low-density parity-check code. The identity matrix variant I* is composed of Toeplitz sub-matrices.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to an encoding method and system for quasi low-density parity-check (LDPC) code.

In an embodiment, the present principles provide a method to compose a generator matrix in (or close to) systematic form. Based on this generator, the present principles further simplify the encoding process in three steps, to directly generate the parity bits from pre-calculated matrix.

The following term definitions are provided.

LDPC code: a class of linear block code, with row and column weight much lower than the rows and columns respectively.

Cyclic code: a linear block error-correcting code that have convenient algebraic structure for efficient error detection and correction. It can be formally defined as: "Let C be a linear code over a finite field GF(q) of block length n. C is called a cyclic code, if for every codeword $c=(c_1, \ldots, c_n)$ from C, the word $(c_n, c_1, \ldots, c_{n-1})$ in $GF(q'')$ obtained by a cyclic right shift of components is again a codeword"

Quasi-cyclic code: A linear block code that can be divided into several blocks, within each block, it is cyclic code.

Circulant: a special kind of Toeplitz matrix where each row vector is rotated one element to the right relative to the preceding row vector Rank: the column or row rank of a matrix is the maximum number of linear independent column or row vectors of the matrix Advantageously, the solution provided by the present principles reduces LDPC encoder complexity, which leads to faster operation and lower cost.

Figure 1:
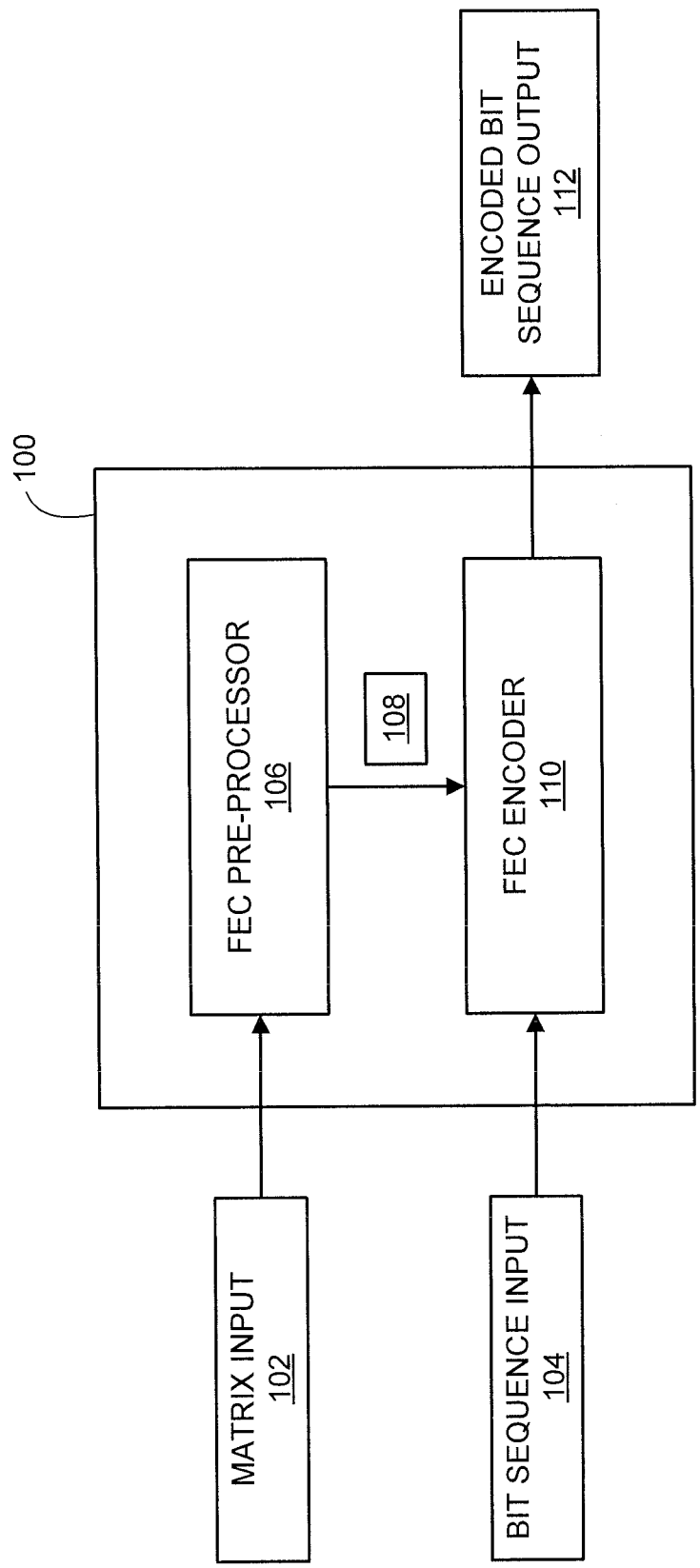
FIG. 1 shows a low-density parity-check (LDPC) code encoding system 100, in accordance with an embodiment of the present principles.

FIG. 1 shows an exemplary low-density parity-check (LDPC) code encoding system 100, in accordance with an embodiment of the present principles. The system 100 can be divided into two sub-systems: an off-line generator-matrix calculation sub-system 106; and encoding sub-system 110.

The off-line generator-matrix calculation sub-system 106 is a computer or other computing system running software to calculate the generator matrix based on given input matrix 102 (usually parity check matrix), using the algorithm described herein.

The encoding sub-system 110 encodes the input bit sequence 104 into the output forward error correction (FEC) code 112, using the above mentioned generator matrix 108. With given matrix 102, the pre-processor 106 executes once, to obtain the generator matrix 108. After the generator matrix 108 is calculated, FEC encoder 110 can be activated to process the input sequence 104.

In an embodiment, encoding sub-system 110 includes a processor 111. In another embodiment, encoding sub-system 110 can use a processor in another element, such as pre-processor 106. These and other variations of system 100 are readily determined by one of ordinary skill in the art given the teachings of the present principles provided herein, while maintaining the spirit of the present principles.

A description will now be given of an encoding algorithm, in accordance with an embodiment of the present principles. The encoding algorithm will be initially described generally, and then further described in additional detail.

The present principles involve an FEC pre-processing stage and an FEC encoding stage. As mentioned herein, the FEC encoding stage can be considered to include three steps.

In the first stage, i.e., the FEC pre-processing stage, generate M, D, Q, and I* matrix (pre-generated). The first stage can involve the following:

(1) D matrix is obtained by: finding the least number of columns of circulants in H with rank r, say l with c≤l≤t, such that these columns of circulants form a c×l sub-array D, whose rank is equal to the rank r of H.

(2) M matrix is obtained by: permuting the columns of circulants of H to form a new c×t array H* of circulants, such that the last (or the rightmost) l columns of circulants of H* form the array of D, then H*=[M|D].

(3) Q matrix is obtained by: removing the linearly dependent rows $D_{dc}(i,j)^T \cdot Q^T$ (1≤i≤l, 1≤j≤$d_c$(i)) from $D^T \cdot Q^T = I^*$; for each column of circulant in $Q^T$, choose the $(d_c(i)+1)$-$^{th}$ column (name as $Q_{d_c(i)}^T = \{q_{i1}, q_{i2}, \ldots, q_{i(lb)}\}$) and generate equation $D^{*T} \cdot Q_{d_c(i)}^T = \{1, 0, \ldots, 0\}^T$, where $D^{*T}$ is $D^T$ with linear dependent rows removed. Setting the lb−r linearly dependent elements $\{q_{ij}\}$ to zeros to have $Q_{d_c(i)}^T$. Generate other columns in $Q^T$ from $Q_{d_c(i)}^T$ to have $Q^T$ in quasi-cyclic mode.

(4) I* calculated from $D^T \cdot Q^T$.

In the second stage, encoding is performed as follows:
(1) Calculate Y=M·X. ps (2) Calculate Z=Q·Y.
(3) Solve P from (Q·D)·P⁺=Z.

An advantage is obtained from the fact that the first step multiplication is with quasi-cyclic sparse matrix which has low complexity, and the second step is the multiplication with cb×cb matrix which has much lower size than other solutions, and the third step of solving P from Toeplitz matrix.

A more detailed description of the encoding algorithm will now be given, in accordance with an embodiment of the present principles.

Assume parity check matrix H (which is matrix input 102 in system 100) of a QC-LDPC code has the form of H(cb×tb), where b is dimension of circulants, c is row circulants and t is column circulants. Further assume the rank of H is r where r<cb.

We first find the least number of columns of circulants in H with rank r, say l with c≤l≤t, such that these columns of circulants form a c×l sub-array D, whose rank is equal to the rank r of H. We permute the columns of circulants of H to form a new c×t array H* of circulants, such that the last (or the rightmost) l columns of circulants of H* form the array of D.

Let H*=[M|D]  (1)

In one embodiment, we use the left-most consecutive columns (if any) of each circulant in D as the linear dependent columns. The following description uses this embodiment as an example, although it is to be appreciated that other columns can be taken in a more general case. Name these columns (from left to right) as $D_{dc}(i,j)$, where i (1≤i≤l) is the column of circulant, and j (1≤j<b) is the column inside that circulant. Set the number of independent columns in each column of circulant as $d_c(i)$ (1≤i≤l), then 1≤j≤$d_c$(i).

Consider the generator matrix in the following form:

$$G_c = \left[ -\frac{I}{O} \middle| G \right],  \quad (2)$$

where I is (tb−lb)×(tb−lb) identity matrix; O is (lb−r)×(tb−lb) matrix of zeros; G={$g_{i,j}$}, where 1≤i≤tb−r, 1≤j≤lb. For j∈{k*b+t, 1≤k≤l, 1≤m≤$d_c$(k)} (i.e., it is the linear dependent column), $g_{i,j}$=1 when i=j and $g_{i,j}$=0 when j≠i. Let generated code be as follows:

$$C = G_c \cdot X = [X^- | P^+],  \quad (3)$$

where X⁻ is the first (tb−lb) of encoded data, and P⁺= [$p_1, p_2, \ldots, p_{lb}$] is parity bits plus the remaining of X. The form of $G_c$ keeps all the information (bit sequence input 104 in FIG. 1) bits which has block length of (tb−r) and generates r parity bits. These tb bits forms encoded bit sequence output 112.

The following embodiments further describe the matrixes 108 and their generation procedure; the usage of 108 in FEC encoder 110 and the procedure to calculate output sequence 112.

Applying H* to C, we have the following:

$$[M|D] \cdot [X^- | P^+] = M \cdot X^- + D \cdot P^+ = 0,  \quad (4)$$

Thus, we have the following:

$$M \cdot X^- = D \cdot P^+  \quad (5)$$

Consider quasi-cyclic matrix Q of dimension lb×lb, and apply it to Equation (5), we get the following:

$$Q \cdot (M \cdot X^-) = Q \cdot (D \cdot P^+),  \quad (6)$$

which is, $$(Q \cdot D) \cdot P^+ = Q \cdot (M \cdot X^-)  \quad (7)$$

In one embodiment, we look for Q to have (Q·D) close to I as follows:

$$D^T \cdot Q^T \sim I  \quad (8)$$

We removing the linear dependent rows $(D_{dc}(i,j))^T \cdot Q^T$, with 1≤i≤l, 1≤j≤$d_c$(i)) in (8) to solve Q. For each column of circulant in $Q^T$, choose the $(d_c(i)+1)$-$^{th}$ column (name as $Q_{d_c(i)}^T = \{q_{i1}, q_{i2}, \ldots, q_{i(lb)}\}$), and generate the following equation:

$$D^{*T} \cdot Q_{d_c(i)}^T = \{1, 0, \ldots, 0\}^T  \quad (9)$$

where $D^{*T}$ is $D^T$ with linear dependent rows removed. $Q_{d_c(i)}^T$ is obtained by setting the lb−r linearly dependent elements $\{q_{ij}\}$ to zeros (these elements correspond to the lb−r linearly dependent columns of $D^{*T}$). Generate other columns in $Q^T$ from $Q_{d_c(i)}^T$ to have $Q^T$ in quasi-cyclic mode (with b×b circulants), and let the following:

$$Q \cdot D = I^* \quad (10)$$

Then I* is of quasi-cyclic form, and can be expressed as follows:

$$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix} \quad (11)$$

From the way Q is obtained, we have the following:

$$A_{i,i} = \begin{bmatrix} 1 & & & & a_{ii,1} & \cdots & a_{ii,d_c(i)} \\ a_{ii,d_c(i)} & 1 & & & & \ddots & \vdots \\ \vdots & \ddots & 1 & & 0 & & a_{ii,1} \\ a_{ii,1} & & \ddots & \ddots & & & \\ & & & \ddots & 1 & & \\ & & & & \ddots & 1 & \\ 0 & & & & a_{ii,1} & \cdots & a_{ii,d_c(i)} & 1 \end{bmatrix} \quad (12)$$

and $$A_{i,j} = \begin{bmatrix} 0 & & & & a_{ij,1} & \cdots & a_{ij,d_c(i)} \\ a_{ij,d_c(i)} & & & & & \ddots & \vdots \\ \vdots & \ddots & & & & & a_{ij,1} \\ a_{ij,1} & & \ddots & 0 & & & \\ & & \ddots & \ddots & & & \\ & & & \ddots & & & \\ 0 & & & & a_{ij,1} & \cdots & a_{ij,d_c(i)} & 1 \end{bmatrix} (j \neq i) \quad (13)$$

Both $A_{i,i}$ and $A_{i,j}$ are a Toeplitz matrices. Q, M, and I* (=Q·D) are the matrices 108 which are generated in 106 and used in 110.

From Equation (7), let $$(Q \cdot D) \cdot P^+ = Q \cdot (M \cdot X^-) \quad (7)$$

$$Q \cdot (M \cdot X^-) = [z_1, z_2, \ldots, z_{lb}] \quad (14)$$

For each row of circulants in I*, from its $(d_c(i)+1)$-th row, we have the following equation:

$$\sum_{i=1}^{l} \sum_{j=1}^{d_c(i)} a_{ik,j} p_{i*b+j} + p_{k*b+d_c(k)+1} = z_{k*b+d_c(k)+1}$$
$$(1 \leq k \leq l), \quad (15)$$

from which we can have $p_{k*b+d_c(k)+1}$ (1≤k≤l). For each row below (say u-th row below $d_c(i)+1$, 1≤u≤b−($d_c(i)+1$)), we have the following:

$$\sum_{i=1}^{l} \sum_{j=1}^{d_c(i)} a_{ik,j} p_{i*b+(j+u)\%(b+1)} + $$
$$p_{k*b+(d_c(k)+1+u)\%(b+1)} = z_{k*b+(d_c(k)+1+u)\%(b+1)} \quad (16)$$

where "%" is modulus operation. So each parity bit can be obtained from the result of previous row.

As from equation (3), C=[X⁻|P⁺] forms the output bit sequence 112 in FIG. 1.

Figure 2:
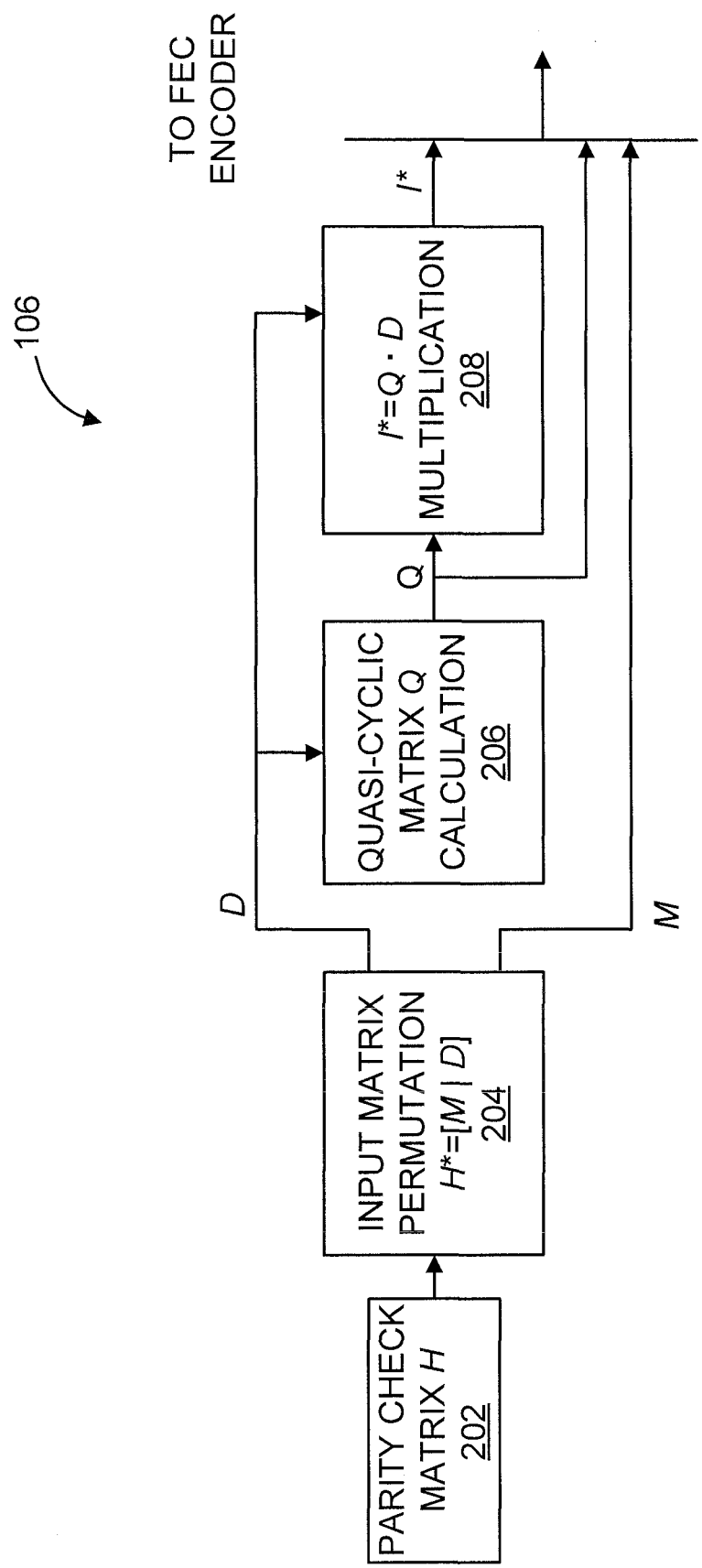
FIG. 2 further shows the FEC pre-processor sub-system 106 of FIG. 1, in accordance with an embodiment of the present principles.

FIG. 2 further shows the FEC pre-processor sub-system 106 of FIG. 1, in accordance with an embodiment of the present principles. The FEC pre-processor sub-system 106 includes an input matrix permutation block 204 (hereinafter "block 204"), a quasi-cyclic matrix Q calculation (calculator) block 206 (hereinafter "block 206"), and a multiplication block 208 (hereinafter "block 208"). A parity check matrix H 202 is input to the sub-system 106.

Figure 3:
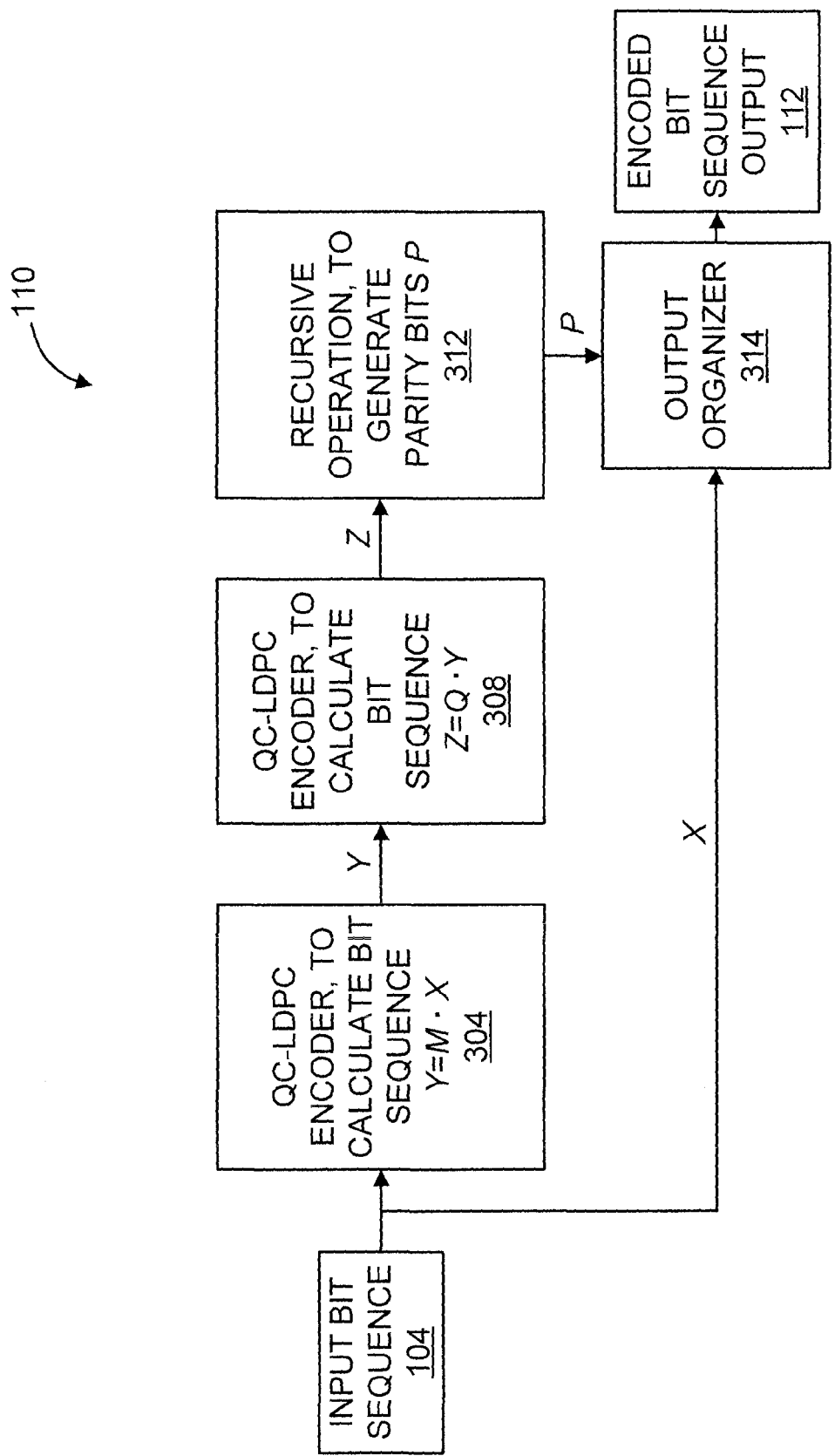
FIG. 3 further shows the FEC encoder 110 of FIG. 1, in accordance with an embodiment of the present principles.

FIG. 3 further shows the FEC encoder 110 of FIG. 1, in accordance with an embodiment of the present principles. The FEC encoder 110 includes a QC-LDPC encoder portion 304 (hereinafter "block 304) for calculating bit sequence Y, a QC-LDPC encoder portion 308 (hereinafter "block 308") for calculating bit sequence Z, recursive operation 312 (hereinafter "block 312") for generating parity bits P, and an output organizer 314. The FEC encoder 110 can also include an output organizer 314 (hereinafter "block 314"). The FEC encoder 100 receives an input bit sequence 104 and provides an encoded bit sequence output 112.

Figure 4:
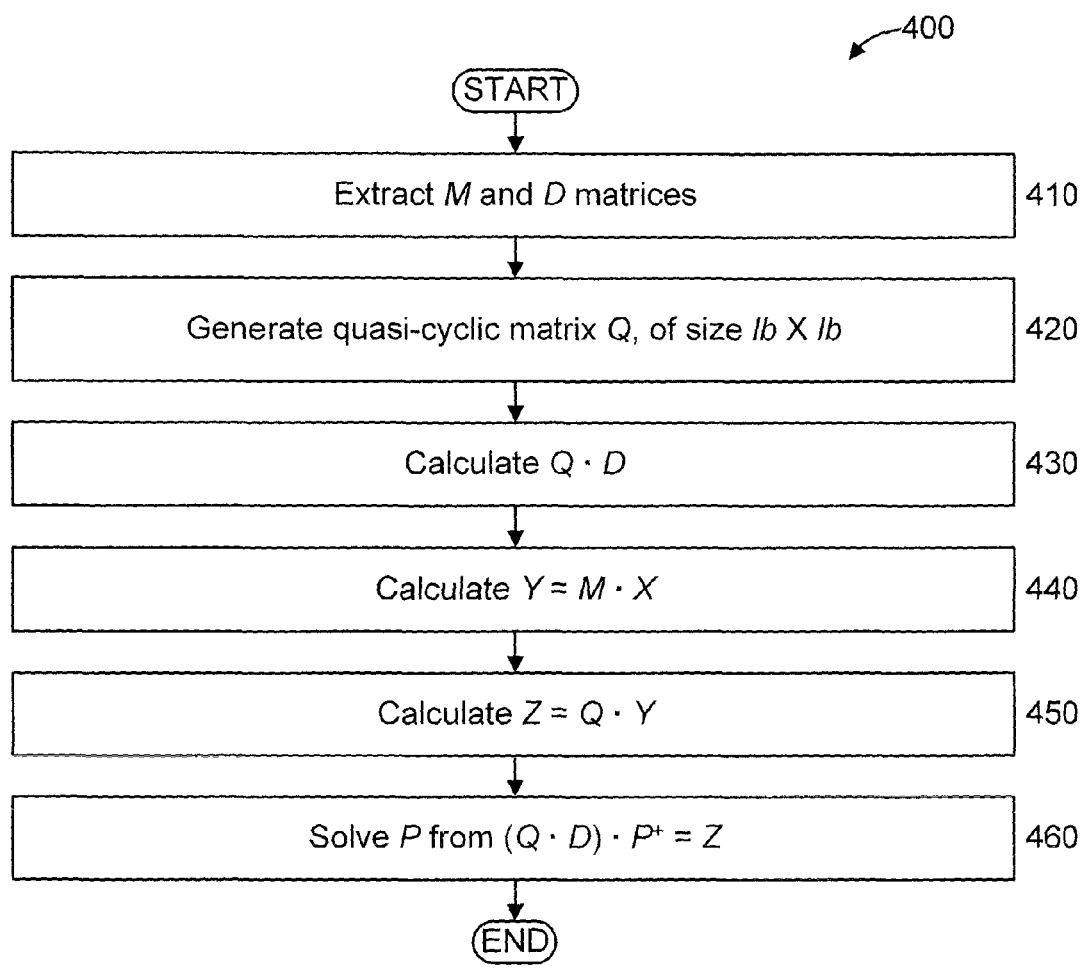
FIG. 4 shows an exemplary method 400 for encoding quasi-cyclic LDPC code, in accordance with an embodiment of the present principles.

FIG. 4 shows an exemplary method 400 for encoding quasi-cyclic LDPC code, in accordance with an embodiment of the present principles. Steps 410 through 430 pertain to FEC pre-processing. Steps 440 through 460 pertain to LDPC encoding.

Steps 410 through 430 are executed in pre-processor 106. From the system point of view, H is the input matrix (or structured bit sequence). Referring to FIGS. 1, 2, and 4, the first operation in 106 is sequence adjustment (column permutation), as block 204 in FIG. 2. M from block 204 is passed to FEC encoder 110, as part of matrixes 108. The second operation is to generate another matrix Q in block 206, which has quasi-cyclic form. Q is also part of matrixes 108 outputted to FEC encoder. D and Q are multiplied in block 208 to get matrix I*. From equation (11)~(13), it can be observed that I* is close to the identity matrix, and the number of non-zero elements depends on the number of linear-dependent columns.

We now describe the FEC pre-processing procedure with respect to steps 410 through 430.

At step 410, extract M and D matrices.

In an embodiment, step 410 involves the following. We first find the least number of columns of circulants in H with rank r, say l with c≤l≤t, such that these columns of circulants form a c×l sub-array D, whose rank is equal to the rank r of H. We permute the columns of circulants of H to form a new c×t array H* of circulants, such that the last (or the rightmost) l columns of circulants of H* form the array of D. Let H*=[M|D].

At step 420, generate quasi-cyclic matrix Q, of size lb×lb.

In an embodiment step 420 involves the following. For each column of circulant in $Q^T$ (i.e., the transposed matrix Q), choose the $(d_c(i)+1)^{th}$ column (name as $Q_{d_c(i)}^T = \{q_{j1}, q_{j2}, \ldots, q_{i(lb)}\}$) and generate the following equation:

$$D^{*T} \cdot Q_{d_c(i)}^T = \{1, 0, \ldots, 0\}^T$$

where $D^{*T}$ is $D^T$ with linear dependent rows removed. $Q_{d_c(i)}^T$ can be obtained by setting the lb−r linearly dependent elements $\{q_{ij}\}$ to zeros (these elements correspond to the lb−r linearly dependent columns of $D^{*T}$). Generate other columns in $Q^T$ from $Q_{d_c(i)}^T$ to have $Q^T$ in quasi-cyclic mode (with b×b circulants).

At step 430, calculate Q·D.

In an embodiment, step 430 can involve the following. An identity matrix can be used as follows:

$$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix}$$

where $$A_{i,i} = \begin{bmatrix} 1 & & & & a_{ii,1} & \cdots & a_{ii,d_c(i)} \\ a_{ii,d_c(i)} & 1 & & & & \ddots & \vdots \\ \vdots & \ddots & 1 & 0 & & & a_{ii,1} \\ a_{ii,1} & & \ddots & \ddots & & & \\ & & & \ddots & 1 & & \\ & & & & \ddots & \ddots & 1 \\ 0 & & & a_{ii,1} & \cdots & a_{ii,d_c(i)} & 1 \end{bmatrix} \text{ for } i = j, \text{ and}$$

and $$A_{i,j} = \begin{bmatrix} 0 & & & & a_{ij,1} & \cdots & a_{ij,d_c(i)} \\ a_{ij,d_c(i)} & & & & & \ddots & \vdots \\ \vdots & \ddots & & & & & a_{ij,1} \\ a_{ij,1} & & \ddots & 0 & & & \\ & \ddots & \ddots & & & & \\ & & \ddots & \ddots & & & \\ 0 & & & a_{ij,1} & \cdots & a_{ij,d_c(i)} & 1 \end{bmatrix} \text{ for } j \neq i.$$

It is to be appreciated that both $A_{i,j}$ and $A_{i,j}$ are Toeplitz matrices.

We now describe the FEC encoding procedure with respect to steps 440 through 460.

At step 440, calculate $Y = M \cdot X$.
At step 450, calculate $Z = Q \cdot Y$.
At step 460, solve P from $(Q \cdot D) \cdot P^+ = Z$.

Thus, steps 440 through 460 involve calculating $Y = M \cdot X$, $Z = Q \cdot Y$, and solving P from $(Q \cdot D) \cdot P^+ = Z$.

In an embodiment, the FEC encoding can involve the following. From its $(d_c(i)+1)$-$th$ row, we have the following equation:

$$\Sigma_{i=1}^{l} \Sigma_{j=1}^{d_c(i)} a_{ik,j} p_{i*b+j} + p_{k*b+d_c(k)+1} = z_{k*b+d_c(k)+1}$$
$(1 \leq k \leq l),$ from which we can have $p_{k*b+d_c(k)+1}$ $(1 \leq k \leq l)$. For each row below (say u-$th$ row below $d_c(i)+1$, $1 \leq u \leq b-(d_c(i)+1))$, we have the following:

$$\Sigma_{i=1}^{l} \Sigma_{j=1}^{d_c(i)} a_{ik,j} p_{i*b+(j+u)\%(b+1)} + p_{k*b+(d_c(k)+1+u)\%(b+1)} = z_{k*b+(d_c(k)+1+u)\%(b+1)}$$

where "%" is modulus operation. So each parity bit can be obtained from the result of the previous row.

For the first operation (block 304 in FIG. 3), $Y = M \cdot X$, because M is low-density quasi-cyclic matrix, either serial or parallel QC-LDPC encoding method can be applied.

In an embodiment, the calculation of $Q \cdot Y$ in step 450 is another quasi-cyclic encoding using a similar approach to step 440.

Regarding 460, a recursive operation (block 312) is performed to recursively calculate parity check bits, with coefficients of Toeplitz sub-matrixes. Thus, the preceding blocks 304, 308, and 312 form a 3-stage encoder. The output is made up of information bits (input sequence 104) and generated parity bits, and can be re-arranged in any sequence by the output organizer (block 314) before being output (112).

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an appendix to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

APPENDIX

Additional Information

Encoding Method And System For Quasi-Cyclic Low-Density Parity-Check Code

A1. Describe the problem that the present invention attempts to solve.

Low-Density Parity-Check (LDPC) codes are commonly given in the form of parity check matrix H. The generator matrix G is required to be orthogonal with parity check matrix H, such that $H \cdot G^T = [O]$ where $[O]$ is zero matrix. Generator matrix G is preferred to be in (or close to) systematic form, i.e., the form of $[I|G']$ where I is identical matrix, so that the encoded data will be composed of direct information bits and parity check bits. Most of the existing encoding methods do not provide systematic form. Such methods increase encoding complexity, and also lead to the difficulty in direct extraction of information bits without decoding.

The present invention proposes a method to compose a generator matrix in (or close to) systematic form. Based on this generator, the present invention further simplifies the encoding process in three steps, to directly generate the parity bits from pre-calculated matrix.

Terms Definition:

LDPC code: a class of linear block code, with row and column weight much lower than the rows and columns respectively.

Cyclic code: a linear block error-correcting code that have convenient algebraic structure for efficient error detection and correction. It's formally defined as:

"Let C be a linear code over a finite field GF(q) of block length n. C is called a cyclic code, if for every codeword $c=(c_1, \ldots, c_n)$ from C, the word $(c_n, c_1, \ldots, c_{n-1})$ in $GF(q^n)$ obtained by a cyclic right shift of components is again a codeword"

Quasi-cyclic code: A linear block code that can be divided into several blocks, within each block, it is cyclic code.

Circulant: a special kind of Toeplitz matrix where each row vector is rotated one element to the right relative to the preceding row vector Rank: the column or row rank of a matrix is the maximum number of linear independent column or row vectors of the matrix A2. How have others attempted to solve the problem described in A1?

Reference [1] in prior art section gives a method to obtain systematic form of generator matrix, for both full-rank matrix and non-full-rank matrix. It calculates the parity check bits directly from this generator matrix using shift-register-adder-accumulator. However, such direct calculation still requires a lot of computation power, because the size of the generator matrix related to parity check bits is about the size of information bit length. For full-rank parity check matrix, the authors further give a two-stage encoding method, which is first multiplying input vector with matrix M, and then multiplying with another matrix $D^{-1}$, with $H_{qc}=[M|D]$, where $H_{qc}$ is obtained from column circulants permutation of H, and D is a square matrix with the same rank as H. The two-phase method greatly saves computation power, but is only feasible for full-rank parity check matrix.

A3. How does the invention solve the problem described in A1?

The present invention further reduces computation cost, for non-full-rank parity check matrix, by first generating a quasi-cyclic matrix Q, to have $D^T \cdot Q^T \sim 1$ (close to identical matrix), where D is generated by finding the least number of columns of circulants in H with rank r, say l with c≤l≤t, such that these columns of circulants form a c×l subarray D. Then we calculate the value of y=M•X where M is the subarray of H with D removed, and X is input vector; then multiply y with Q to have z, and then use Q•D as coefficient to solve parity bits P.

B. What is the specific competitive/commercial value of the solution achieved by the present invention (e.g., less complexity, faster operation, lower cost, higher quality, etc.)?

The solution of the present invention reduces LDPC encoder complexity, which leads to faster operation and lower cost.

System Description

As given in FIG. 1, the present invention related system 100 can be divided into two sub-systems: off-line generator-matrix calculation system 106, which is a computer or other computing system running software to calculate the generator matrix based on given input matrix 102 (usually parity check matrix), using the algorithm described in the present invention; encoding sub-system 110 which is either a dedicated hardware or software, to encode the input bit sequence 104 into the output FEC code 112, using the above mentioned generator matrix 108. With given matrix 102, the pre-processor 106 executes once, to obtain 108. After 108 is calculated, FEC encoder 110 can be activated to process the input sequence 104.

Algorithm (Mathematical)

Assume parity check matrix H (which is matrix input 102 in system 100) of a QC-LDPC code has the form of H (cb×tb), where h is dimension of circulants, c is row circulants and t is column circulants. Further assume the rank of H is r where r<cb. We first find the least number of columns of circulants in H with rank r, say l with c≤l≤t, such that these columns of circulants form a c×l subarray D, whose rank is equal to the rank r of H. We permute the columns of circulants of H to form a new c×t array H* of circulants, such that the last (or the rightmost) l columns of circulants of H* form the array of D. Let $$H^* = [M|D]. \quad (1)$$

In one embodiment, we use the left-most consecutive columns (if any) of each circulant in D as the linear dependent columns. The following description uses this embodiment as example, though other columns can be taken in more general case. Name these columns (from left to right) as $D_{dc}(i, j)$, where i (1≤i≤l) is the column of circulant, and j (1≤j<b) is the column inside that circulant. Set the number of independent columns in each column of circulant as $d_c(i)$ (1≤i≤l), then $1 \leq j \leq d_c(i)$.

Consider generator matrix in the form of $$G_c = \left[ -\frac{I}{O} \mid G \right], \quad (2)$$

where I is (tb−lb)×(tb−lb) identical matrix; O is (lb−r)×(tb−lb) matrix of zeros; G={$g_{i,j}$}, where 1≤i≤tb−r, 1≤j≤lb. For j∈{k*b+t, 1≤k≤l, 1≤m≤$d_c(k)$} (i.e., it is the linear dependent column), $g_{i,j}=1$ when i=j and $g_{i,j}=0$ when j≠i. Let generated code $$C = G_c \cdot X = [X^- | P^+], \quad (3)$$

where $X^-$ is the first (tb−lb) of encoded data, and $P^+ = [p_1, p_2, \ldots, p_{lb}]$ is parity bits plus the remaining of X. The form of $G_c$ keeps all the information (bit sequence input 104 in FIG. 1) bits which has block length of (tb−r) and generates r parity bits. These tb bits forms encoded bit sequence output 112.

The following embodiments further describe the matrixes 108 and their generation procedure; the usage of 108 in FEC encoder 110 and the procedure to calculate output sequence 112.

Apply H* to C, we have:

$$[M|D] \cdot [X^- | P^+] = M \cdot X^- + D \cdot P^+ = 0, \quad (4)$$

So, $$M \cdot X^- = D \cdot P^+ \quad (5)$$

Consider quasi-cyclic matrix Q of dimension lb×lb, and apply to equation (5), we get $$Q \cdot (M \cdot X^-) = Q \cdot (D \cdot P^+), \quad (6)$$

which is, $$(Q \cdot D) \cdot P^+ = Q \cdot (M \cdot X^-) \quad (7)$$

In one embodiment, we look for Q to have (Q·D) close to I:

$$D^T \cdot Q^T \sim I \quad (8)$$

We removing the linear dependent rows $(D_{dc}(i,j)^T \cdot Q^T$, with $1 \le i \le l$, $1 \le j \le d_c(i)$) in (8) to solve Q. For each column of circulant in $Q^T$, choose the $(d_c(i)+1)$-$th$ column (name as $Q_{d_c(i)}^T = \{q_{i1}, q_{i2}, \ldots, q_{i(lb)}\}$) and generate the following equation:

$$D^{*T} \cdot Q_{d_c(i)}^T = \{1, 0, \ldots, 0\}^T \quad (9)$$

where $D^{*T}$ is $D^T$ with linear dependent rows removed. $Q_{d_c(i)}^T$ is obtained by setting the lb−r linearly dependent elements $\{q_{ij}\}$ to zeros (these elements correspond to the lb−r linearly dependent columns of $D^{*T}$). Generate other columns in $Q^T$ from $Q_{d_c(i)}^T$ to have $Q^T$ in quasi-cyclic mode (with b×b circulants), and let $$Q \cdot D = I^* \quad (10)$$

Then I* is of quasi-cyclic form, and can be expressed as $$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix} \quad (11)$$

From the way Q is obtained, we have $$A_{i,i} = \begin{bmatrix} 1 & & & a_{ii,1} & \cdots & a_{ii,d_c(i)} \\ a_{ii,d_c(i)} & 1 & & & \ddots & \vdots \\ \vdots & \ddots & 1 & 0 & & a_{ii,1} \\ a_{ii,1} & & \ddots & \ddots & & \\ & \ddots & & \ddots & 1 & \\ & & \ddots & & \ddots & 1 \\ 0 & & a_{ii,1} & \cdots & a_{ii,d_c(i)} & 1 \end{bmatrix} \quad (12)$$

and $$A_{i,j} = \begin{bmatrix} 0 & & & a_{ij,1} & \cdots & a_{ij,d_c(i)} \\ a_{ij,d_c(i)} & & & & \ddots & \vdots \\ \vdots & \ddots & & & & a_{ij,1} \\ a_{ij,1} & & \ddots & 0 & & \\ & \ddots & & & & \\ & & \ddots & & & \\ 0 & & a_{ij,1} & \cdots & a_{ij,d_c(i)} & 1 \end{bmatrix} (j \ne i) \quad (13)$$

Both $A_{i,j}$ and $A_{i,j}$ are Toeplitz matrix. Q, M, and I*(=Q·D) are the matrixes 108 which are generated in 106 and used in 110. From equation (7), let $$(Q \cdot D) \cdot P^+ = Q \cdot (M \cdot X^-) \quad (7)$$

$$Q \cdot (M \cdot X^-) = [z_1, z_2, \ldots, z_{lb}] \quad (14)$$

For each row of circulants in I*, from its $(d_c(i)+1)$-$th$ row, we have equation $$\Sigma_{i=1}^l \Sigma_{j=1}^{d_c(i)} a_{ik,j} \cdot p_{i*b+j} + p_{k*b+d_c(k)+1} = z_{k*b+d_c(k)+1}$$
$$(1 \le k \le l), \quad (15)$$

from which we can have $p_{k*b+d_c(k)+1}$ ($1 \le k \le l$). For each row below (say u-$th$ row below $d_c(i)+1$, $1 \le u \le b-(d_c(i)+1)$), we have $$\Sigma_{i=1}^l \Sigma_{j=1}^{d_c(i)} a_{ik,j} \cdot p_{i*b+(j+u)\%(b+1)} +$$
$$p_{k*b+(d_c(k)+1+u)\%(b+1)} = z_{k*b+(d_c(k)+1+u)\%(b+1)} \quad (16)$$

"%" is modulus operation. So each parity bit can be obtained from the result of previous row.

As from equation (3), $C = [X^-|P^+]$ forms the output bit sequence 112 in FIG. 1.

Procedure Explanation:

1) extract M and D matrix:

We first find the least number of columns of circulants in H with rank r, say l with c≤l≤t, such that these columns of circulants form a c×l subarray D, whose rank is equal to the rank r of H. We permute the columns of circulants of H to form a new c×t array H* of circulants, such that the last (or the rightmost) l columns of circulants of H* form the array of D. Let $$H^* = [M|D]$$

2) Generate quasi-cyclic matrix Q, of size lb×lb:

For each column of circulant in $Q^T$, choose the $(d_c(i)+1)$-$th$ column (name as $Q_{d_c(i)}^T = \{q_{i1}, q_{i2}, \ldots, q_{i(lb)}\}$) and generate the following equation:

$$D^{*T} \cdot Q_{d_c(i)}^T = \{1, 0, \ldots, 0\}^T$$

where $D^{*T}$ is $D^T$ with linear dependent rows removed. $Q_{d_c(i)}^T$ can be obtained by setting the lb−r linearly dependent elements $\{q_{ij}\}$ to zeros (these elements correspond to the lb−r linearly dependent columns of $D^{*T}$). Generate other columns in $Q^T$ from $Q_{d_c(i)}^T$ to have $Q^T$ in quasi-cyclic mode (with b×b circulants)

3) Calculate Q·D

With the above method, we can have $$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix}$$

where $$A_{i,i} = \begin{bmatrix} 1 & & & a_{ii,1} & \cdots & a_{ii,d_c(i)} \\ a_{ii,d_c(i)} & 1 & & & \ddots & \vdots \\ \vdots & \ddots & 1 & 0 & & a_{ii,1} \\ a_{ii,1} & & \ddots & \ddots & & \\ & & & \ddots & 1 & \\ & & & & \ddots & 1 \\ 0 & & a_{ii,1} & \cdots & a_{ii,d_c(i)} & 1 \end{bmatrix}$$

and $$A_{i,j} = \begin{bmatrix} 0 & & & a_{ij,1} & \cdots & a_{ij,d_c(i)} \\ a_{ij,d_c(i)} & & & & \ddots & \vdots \\ \vdots & \ddots & & & & a_{ij,1} \\ a_{ij,1} & & \ddots & 0 & & \\ & \ddots & & & & \\ & & \ddots & & & \\ 0 & & a_{ij,1} & \cdots & a_{ij,d_c(i)} & 1 \end{bmatrix} (j \ne i)$$

Both $A_{i,j}$ and $A_{i,j}$ are Toeplitz matrix.

The above steps are executed in pre-processor 106. For system point of view, H is the input matrix (or structured bit sequence); the first operation in 106 is sequence adjustment (column permutation), as block 204 in FIG. 2. M from 204 is passed to FEC encoder 110, as part of matrixes 108; second operation is to generate another matrix Q in 206, which has quasi-cyclic form. Q is also part of matrixes 108 outputted to FEC encoder. D and Q are multiplied in 208 to get matrix I* which is close to identical matrix.
Now is the encoding procedure:
  calculate Y=M•X, Z=Q•Y, and solve P from (Q·D)·P⁺=Z following the procedure:
    from its $(d_c(i)+1)$-$^{th}$ row, we have equation $$\sum_{i=1}^{l}\sum_{j=1}^{d_c(i)} a_{ik,j} \cdot p_{i*b+j} + p_{k*b+d_c(k)+1} = z_{k*b+d_c(k)+1}$$
$(1 \le k \le l),$ from which we can have $p_{k*b+d_c(k)+1}$ ($1 \le k \le l$). For each row below (say $u$-$^{th}$ row below $d_c(i)+1$, $1 \le u \le b-(d_c(i)+1)$), we have $$\sum_{i=1}^{l}\sum_{j=1}^{d_c(i)} a_{ik,j} \cdot p_{i*b+(j+u)\%(b+1)} + p_{k*b+(d_c(k)+1+u)\%(b+1)} = z_{k*b+(d_c(k)+1+u)\%(b+1)}$$

"%" is modulus operation. So each parity bit can be obtained from the result of previous row.
For the first operation (block 304 in FIG. 3), Y=M•X, because M is low-density quasi-cyclic matrix, either serial or parallel QC-LDPC encoding method can be applied, as from prior art [1]. The second step Q•Y (308) is another quasi-cyclic encoder using similar approach. The third step (312) is to recursively calculate parity check bits, with coefficients of Toeplitz sub-matrixes. So it makes a 3-stage encoder. The output is made up of information bits (input sequence 104) and generated parity bits, and can be re-arranged in any sequence (314) before output (112).
1. A method to generate parity check encoded data; the parity check matrix H is QC-LDPC code; the rank r of H is less than its row number. Three steps encoding is applied to generate parity check bits, where the first step is to apply one matrix M to input vector X⁻, to generate vector Y; and the second step to apply a second matrix Q to Y, to generate vector Z; and the third step to solve the equation of parity bits P from Z and a third matrix I*. The first two steps are QC-LDPC encoder that may use feed-back shift registers.
  1.1. Matrix M is a subset of H, generated by removing some circulants from H
    1.1.1. The removed circulants are named matrix D, generated by: finding the least number of columns of circulants in H with rank r, such that these columns of circulants form subarray D, whose rank is equal to the rank r of H.
  1.2. H is reorganized to H* in form of H*=[M|D]
  1.3. I* is a matrix close to identical matrix
    1.3.1. I* is of quasi-cyclic form $$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix},$$

where $A_{i,j}$ ($\mathbf{1}=1, \ldots, 1$; j=1, \ldots, 1) is a cyclic circulant, each circulant of the same size as that in H 1.3.1.1. l is the least number of columns of circulants in H with rank r
    1.3.1.2. $A_{i,j}$ is Toeplitz matrix, with the form of $$A_{i,i} = \begin{bmatrix} 1 & & a_{ii,1} & \cdots & a_{ii,d_c(i)} \\ a_{ii,d_c(i)} & 1 & & & \ddots & \vdots \\ \vdots & \ddots & 1 & & 0 & a_{ii,1} \\ a_{ii,1} & & \ddots & \ddots & & \\ & & & \ddots & 1 & \\ & & & & \ddots & 1 \\ 0 & & a_{ii,1} & \cdots & a_{ii,d_c(i)} & 1 \end{bmatrix} \text{ for } i=j, \text{ and}$$

$$A_{i,j} = \begin{bmatrix} 0 & & a_{ij,1} & \cdots & a_{ij,d_c(i)} \\ a_{ij,d_c(i)} & & & & \ddots & \vdots \\ \vdots & \ddots & & & & a_{ij,1} \\ a_{ij,1} & & \ddots & 0 & & \\ & \ddots & \ddots & & & \\ & & \ddots & \ddots & & \\ 0 & & a_{ij,1} & \cdots & a_{ij,d_c(i)} & 1 \end{bmatrix} \text{ for } j \ne i.$$

1.4. Q is the matrix to have Q·D=I*
    1.4.1. Q is in quasi-cyclic form
    1.4.2. Q is obtained by solving $D^{*T} \cdot Q_{k(i)}^T = \{1,0,\ldots,0\}^T$, where $D^{*T}$ is from $D^T$ with linear dependent rows removed; $Q_{k(i)}^T$ is a selected column of the i-th circulant in Q
      1.4.2.1. The linear dependent rows of $D^T$ are selected from the first columns of each circulant
      1.4.2.2. The selected k is the $(d_c(i)+1)$-$^{th}$, where $d_c(i)$ is the number of linear dependent rows in circulant i of matrix $D^T$
      1.4.2.3. $Q_{k(i)}^T$ is obtained by setting its linearly dependent elements $\{q_{ij}\}$ to zeros, where these linearly dependent elements correspond to the linearly dependent columns of $D^{*T}$
  1.5. The generator has the form of $$G_c = \left[ -\frac{I}{O} \mid G \right],$$

where I is (tb−lb)×(tb−lb) identical matrix; O is (lb−r)×(tb−lb) matrix of zeros; G={$g_{i,j}$}, where $1 \le i \le tb-r$, $1 \le j \le lb$. (t is the number of column circulants in H, b is the matrix size of each circulant)
    1.5.1. For the corresponding linear dependent columns in D, for $j \in \{k*b+t, 1 \le k \le l, 1 \le m \le d_c(k)\}$, $g_{i,j}=1$ when i=j and $g_{i,j}=0$ when $j \ne i$
    1.5.2. Encoded data is of form [X⁻|P⁺], where X⁻ is the first (tb−lb) of encoded data, and P⁺=[$p_1, p_2, \ldots, p_{lb}$] is parity bits plus the remaining of X
At least the following parts are new from the prior art:
  1) the way to generate Q, to make D•Q close to I (call I*)
  2) I* is Toeplitz matrix
  3) the three steps approach to obtain P, by first multiplying M with input vector X to get y, then multiplying y with Q to have z, and then solve P from I*•P=z.
Step 1: Generate M, D, Q, and I* Matrix (Pre-generated)
  1) D matrix is obtained by: finding the least number of columns of circulants in H with rank r, say l with $c \le l \le t$, such that these columns of circulants form a c×l subarray D, whose rank is equal to the rank r of H 2) M matrix is obtained by: permuting the columns of circulants of H to form a new c×t array H* of circulants, such that the last (or the rightmost) l columns of circulants of H* form the array of D, then H*=[M|D]

3) Q matrix is obtained by: removing the linearly dependent rows from $D_{dc}(i,j)^T \cdot Q^T$ (123 i≤l, 1≤j≤$d_c$(i)); for each column of circulant in $Q^T$, choose the $(d_c(i)+1)$-th column (name as $Q_{d_c(i)}^T = \{q_{i1}, q_{i2}, \ldots, q_{i(lb)}\}$) and generate equation $D^{*T} \cdot Q_{d_c(i)}^T = \{1,0,\ldots,0\}^T$, where $D^{*T}$ is $D^T$ with linear dependent rows removed. Setting the lb−r linearly dependent elements $\{q_{ij}\}$ to zeros to have $Q_{d_c(i)}^T$. Generate other columns in $Q^T$ from $Q_{d_c(i)}^T$ to have $Q^T$ in quasi-cyclic mode.

4) I* calculated from $D^T \cdot Q^T$

Step 2: Encoding
1) Calculate Y=M•X
2) Calculate Z=Q•Y
3) Solve P from (Q·D)·P*=Z The advantage is obtained from the fact that the first step multiplication is with quasi-cyclic sparse matrix which has low complexity, and the second step is the multiplication with cb×cb matrix which has much lower size than other solutions, and the third step of solving P from Toeplitz matrix.

2.—Prior Art. List patents, articles, or publications you believe are closest to steps/features in 1c/1d and/or provide a block diagram of what is known with respect to steps/features in 1c/1d.

[1] Zongwang Li, et. al., "Efficient Encoding of Quasi-Cyclic Low-Density Parity-Check Codes", IEEE TRANSACTIONS ON COMMUNICATIONS, VOL. 54, NO. 1, JANUARY 2006

What is claimed is:

1. A method for reducing Low-Density Parity Check (LDPC) encoding complexity, comprising:
generating quasi-cyclic low-density parity check (LDPC) encoded data from a received input bit sequence, the generating comprising:
applying a quasi-cyclic matrix M to an input vector X⁻ of encoded data to generate a vector Y;
applying a matrix Q to the vector Y to generate a vector Z;
recursively generating, using a processor, parity check bits P for the encoded data from the vector Z and an identity matrix variant I*, wherein the identity matrix variant I* is determined as follows: I*=Q·D; wherein the encoded data comprises quasi-cyclic low-density parity-check code, and the identity matrix variant I* is composed of Toeplitz matrices;
receiving a parity check matrix H of quasi-cyclic low-density parity-check code, wherein a rank r of the parity check matrix H is less than a number of rows of the parity check matrix H, and wherein the quasi-cyclic matrix M is a subset of the parity check matrix H, generated by removing at least some circulants from the parity check matrix H;
generating a matrix D from the at least some circulants removed from the parity check matrix H, wherein the at least some circulants that are removed from the parity check matrix H are determined for removal by finding a least number of columns of circulants in the parity check matrix H with the rank r, and wherein the matrix D is generated to have a rank equal to the rank r of the parity check matrix H; and
combining the encoded data with the parity check bits to form one or more encoded output signals for data transmission.

2. The method of claim 1, wherein said applying steps are performed using feedback shift registers.

3. The method of claim 1, wherein the identify matrix variant I* is of a quasi-cyclic form as follows:

$$I^* = \begin{bmatrix} A_{1,1} & A_{1,2} & \cdots & A_{1,l} \\ A_{2,1} & A_{2,2} & \cdots & A_{2,l} \\ \vdots & \vdots & \ddots & \vdots \\ A_{l,1} & A_{l,2} & \cdots & A_{l,l} \end{bmatrix},$$

wherein $A_{i,j}$ (i=1, ..., l; j=1, ..., l) is a cyclic circulant of a same size as circulants in the parity check matrix H, and l is a least number of columns of circulants in H with rank r.

4. The method of claim 3, wherein $A_{i,j}$ is a Toeplitz matrix having a form as follows:

$$A_{i,i} = \begin{bmatrix} 1 & & a_{ii,1} & \cdots & a_{ii,d_c(i)} \\ a_{ii,d_c(i)} & 1 & & \ddots & \vdots \\ \vdots & \ddots & 1 & 0 & a_{ii,1} \\ a_{ii,1} & & \ddots & \ddots & \\ & & \ddots & \ddots & 1 \\ & & & \ddots & \ddots & \\ 0 & & a_{ii,1} & \cdots & a_{ii,d_c(i)} & 1 \end{bmatrix} \text{ for } i = j, \text{ and}$$

$$A_{i,j} = \begin{bmatrix} 0 & & a_{ij,1} & \cdots & a_{ij,d_c(i)} \\ a_{ij,d_c(i)} & & & \ddots & \vdots \\ \vdots & \ddots & & & a_{ij,1} \\ a_{ij,1} & \ddots & 0 & & \\ & \ddots & \ddots & & \\ & & \ddots & \ddots & \\ 0 & & a_{ij,1} & \cdots & a_{ij,d_c(i)} & 1 \end{bmatrix} \text{ for } j \neq i.$$

5. The method of claim 1, wherein the matrix Q is a quasi-cyclic matrix.

6. The method of claim 1, wherein the matrix Q is obtained by solving $D^{*T} \cdot Q_{k(i)}^T = \{1,0,\ldots,0\}^T$, where $D^T$ is determined from the matrix D, $D^{*T}$ is determined from $D^T$ with linear dependent rows of $D^T$ removed, and wherein $Q_{k(i)}^T$ is a selected column of an i-th circulant in the matrix Q.

7. The method of claim 6, wherein the linear dependent rows of $D^T$ are selected from first columns of each circulant in $D^T$.

8. The method of claim 6, wherein $Q_{k(i)}^T$ is obtained by setting linearly dependent elements $\{q_{ij}\}$ in the matrix Q to zeros, wherein the linearly dependent elements $\{q_{ij}\}$ correspond to linearly dependent columns of $D^{*T}$.

9. The method of claim 1, wherein said generating step uses a generator function $G_C$ having a form of $$G_c = \left[ -\frac{I}{O} \mid G \right],$$

wherein I is a (tb−lb)×(tb−lb) identity matrix from which the identity matrix variant I* is derived, O is a (lb−r)×(tb−lb) matrix of zeros, G={$g_{i,j}$}, 1≤i≤tb−r, 1≤j≤lb, t is a number of column circulants in a parity check matrix H having quasi-cyclic low-density parity-check code, l is a number of row circulants in the parity check matrix H, and b is a matrix size.

10. The method of claim 9, wherein said generator function outputs parity check encoded data of a form $[X^-|P^+]$, wherein the vector $X^-$ is a first (tb−lb) of encoded data, and $P^+=[p_1,p_2,\ldots,p_{lb}]$ is parity bits plus a remainder of an input vector X from which the vector $X^-$ is derived.

11. A computer program product comprising a non-transitory computer readable storage medium having computer readable program code embodied therein for performing a method for reducing Low-Density Parity Check (LDPC) encoding complexity, the method comprising:
  generating quasi-cyclic low-density parity check (LDPC) encoded data from a received input bit sequence, the generating comprising:
  applying a quasi-cyclic matrix M to an input vector X of encoded data to generate a vector Y;
  applying a matrix Q to the vector Y to generate a vector Z;
  recursively generating parity check bits P for the encoded data from the vector Z and an identity matrix variant I*, wherein the identity matrix variant I* is determined as follows: I*=Q·D,
  wherein the encoded data comprises quasi-cyclic low-density parity-check code, and the identity matrix variant I* is composed of Toeplitz matrices;
  receiving a parity check matrix H of quasi-cyclic low-density parity-check code, wherein a rank r of the parity check matrix H is less than a number of rows of the parity check matrix H, and wherein the quasi-cyclic matrix M is a subset of the parity check matrix H, generated by removing at least some circulants from the parity check matrix H;
  generating a matrix D from the at least some circulants removed from the parity check matrix H, wherein the at least some circulants that are removed from the parity check matrix H are determined for removal by finding a least number of columns of circulants in the parity check matrix H with the rank r, and wherein the matrix D is generated to have a rank equal to the rank r of the parity check matrix H; and
  combining the encoded data with the parity check bits to form one or more encoded output signals for data transmission.

12. The computer program product of claim 11, wherein said applying steps are performed using feedback shift registers.

13. The computer program product of claim 11, wherein the identify matrix variant I* is of a quasi-cyclic form as follows:

$$I^* = \begin{bmatrix} A_{1,1} & A_{1,2} & \ldots & A_{1,l} \\ A_{2,1} & A_{2,2} & \ldots & A_{2,l} \\ \vdots & \vdots & \ddots & \vdots \\ A_{l,1} & A_{l,2} & \ldots & A_{l,l} \end{bmatrix},$$

wherein $A_{i,j}$ (i=1, ..., l; j=1, ..., l) is a cyclic circulant of a same size as circulants in the parity check matrix H, and l is a least number of columns of circulants in H with rank r.

14. A system for reducing Low-Density Parity Check (LDPC) encoding complexity, comprising:
  an encoder, configured to generate, using a processor, quasi-cyclic low-density parity check (LDPC) encoded data from a received input bit sequence, the encoder being further configured to:
  apply a quasi-cyclic matrix M to an input vector $X^-$ of encoded data to generate a vector Y;
  apply a matrix Q to the vector Y to generate a vector Z;
  recursively generate, using a processor, parity check bits P for the encoded data from the vector Z and an identity matrix variant I*, wherein the identity matrix variant I* is determined as follows: I*=Q·D, wherein the encoded data comprises quasi-cyclic low-density parity-check code, and the identity matrix variant I* is composed of Toeplitz matrices
  receive a parity check matrix H of quasi-cyclic low-density parity-check code, wherein a rank r of the parity check matrix H is less than a number of rows of the parity check matrix H, and wherein the quasi-cyclic matrix M is a subset of the parity check matrix H, generated by removing at least some circulants from the parity check matrix H;
  generate a matrix D from the at least some circulants removed from the parity check matrix H, wherein the at least some circulants that are removed from the parity check matrix H are determined for removal by finding a least number of columns of circulants in the parity check matrix H with the rank r, and wherein the matrix D is generated to have a rank equal to the rank r of the parity check matrix H; and
  combine the encoded data with the parity check bits to form one or more encoded output signals for data transmission.

\* \* \* \* \*